United States Patent
Wang et al.

(10) Patent No.: US 11,747,376 B2
(45) Date of Patent: Sep. 5, 2023

(54) PHOTONIC DEVICE AND A TERAHERTZ SIGNAL GENERATOR

(71) Applicant: City University of Hong Kong, Kowloon (HK)

(72) Inventors: Cheng Wang, Kowloon (HK); Jingwei Yang, Kowloon (HK)

(73) Assignee: City University of Hong Kong, Kowloon (HK)

( * ) Notice: Subject to any disclaimer, the term of this patent is extended or adjusted under 35 U.S.C. 154(b) by 292 days.

(21) Appl. No.: 17/220,209

(22) Filed: Apr. 1, 2021

(65) Prior Publication Data
US 2022/0317166 A1 Oct. 6, 2022

(51) Int. Cl.
*G01R 23/17* (2006.01)
*G01N 21/3581* (2014.01)
*G01M 11/00* (2006.01)

(52) U.S. Cl.
CPC .......... *G01R 23/17* (2013.01); *G01M 11/335* (2013.01); *G01N 21/3581* (2013.01)

(58) Field of Classification Search
CPC . G01R 23/17; G01M 11/335; G01N 21/3581; G02F 2203/13; G02F 1/365; G02F 1/353
See application file for complete search history.

(56) References Cited

U.S. PATENT DOCUMENTS

| | | | |
|---|---|---|---|
| 7,515,801 B2 | 4/2009 | McCaughan et al. | |
| 7,649,328 B2 | 1/2010 | Smirnov et al. | |
| 8,805,148 B2 | 8/2014 | Avouris et al. | |
| 9,178,282 B2 | 11/2015 | Mittleman et al. | |
| 9,515,367 B2 | 12/2016 | Herbsommer et al. | |
| 2003/0113065 A1* | 6/2003 | Ohmura | G02B 6/02138 385/37 |
| 2005/0242287 A1* | 11/2005 | Hakimi | G02F 1/353 250/363.09 |
| 2008/0190213 A1* | 8/2008 | Lang | G01P 5/245 73/861.28 |
| 2012/0032080 A1* | 2/2012 | Koyama | G02F 1/353 359/326 |

(Continued)

OTHER PUBLICATIONS

Y. Shen, a. T. Lo, P. Taday, B. Cole, W. Tribe, and M. Kemp, "Detection and identification of explosives using terahertz pulsed spectroscopic imaging," Applied physics letters 86, 241116 (2005).

(Continued)

*Primary Examiner* — Jermele M Hollington
*Assistant Examiner* — Zannatul Ferdous
(74) *Attorney, Agent, or Firm* — RENNER KENNER GREIVE BOBAK TAYLOR & WEBER

(57) ABSTRACT

A photonic device and a continuous-wave THz signal generator using such photonic device. The photonic device includes an input waveguide arranged to receive input waves of at least two input frequencies and to generate photons at an output frequency associated with the at least two input frequencies; an output waveguide coupled to the input waveguide and arranged to collect the generated photons at the output frequency; wherein the output waveguide is further arranged to facilitate an amplification of the generated photons as the generated photons propagates along the output waveguide and arranged to output an amplified signal at the output frequency.

24 Claims, 7 Drawing Sheets

(56) References Cited

U.S. PATENT DOCUMENTS

| | | | |
|---|---|---|---|
| 2013/0015375 A1* | 1/2013 | Avouris | G02F 1/353 |
| | | | 977/734 |
| 2016/0233379 A1 | 8/2016 | Qin et al. | |
| 2016/0352072 A1 | 12/2016 | Belkin et al. | |
| 2017/0092677 A1* | 3/2017 | Ikakura | H01L 27/14605 |
| 2018/0113373 A1* | 4/2018 | Witmer | G02F 1/017 |
| 2018/0128974 A1* | 5/2018 | Iida | H01L 27/1203 |
| 2019/0068282 A1* | 2/2019 | Neuman | H01Q 3/2682 |
| 2021/0096444 A1* | 4/2021 | Zhang | G02F 1/3536 |

OTHER PUBLICATIONS

K. B. Cooper, R. J. Dengler, N. Llombart, B. Thomas, G. Chattopadhyay, and P. H. Siegel, "THz Imaging Radar for Standoff Personnel Screening," IEEE Transactions on Terahertz Science and Technology 1, 169-182 (2011).

G. K. Kitaeva, "Terahertz generation by means of optical lasers," Laser Physics Letters 5, 559-576 (2008).

R. Kohler, A. Tredicucci, F. Beltram, H. E. Beere, E. H. Linfield, A. G. Davies, D. A. Ritchie, R. C. Iotti, and F. Rossi, "Terahertz semiconductor—heterostructure laser," Nature 417, 156-159 (2002).

P. Chevalier, A. Amirzhan, F. Wang, M. Piccardo, S. Johnson, F. Capasso, and H. Everitt, "Widely tunable compact terahertz gas lasers (vol. 366, p. 856, 2019)," Science 368(2020).

N. T. Yardimci, S.-H. Yang, C. W. Berry, and M. Jarrahi, "High-power terahertz generation using large-area plasmonic photoconductive emitters," IEEE Transactions on Terahertz Science and Technology 5, 223-229 (2015).

M. De Regis, S. Bartalini, M. Ravaro, D. Calonico, P. De Natale, and L. Consolino, "Room-Temperature Continuous-Wave Frequency-Referenced Spectrometer up to 7.5 THz," Phys. Rev. Appl. 10, 064041 (2018).

M. De Regis, L. Consolino, S. Bartalini, and P. De Natale, "Waveguided Approach for Difference Frequency Seneration of Broadly-Tunable Continuous-Wave Terahertz Radiation," Appl. Sci. 8(2018).

S. Bodrov, M. Bakunov, and M. Hangyo, "Efficient Cherenkov emission of broadband terahertz radiation from an ultrashort laser pulse in a sandwich structure with nonlinear core," Journal of Applied Physics 104, 093105 (2008).

S. Carbajo, J. Schulte, X. Wu, K. Ravi, D. N. Schimpf, and F. X. Kärtner, "Efficient narrowband terahertz generation in cryogenically cooled periodically poled lithium niobate," Opt. Lett. 40, 5762-5765 (2015).

H. Amarloo, N. Ranjkesh, and S. A. Safavi-Naeini, "Terahertz silicon-BCB-quartz dielectric waveguide: an efficient platform for compact THz systems," IEEE Transactions on Terahertz Science and Technology 8, 201-208 (2018).

* cited by examiner

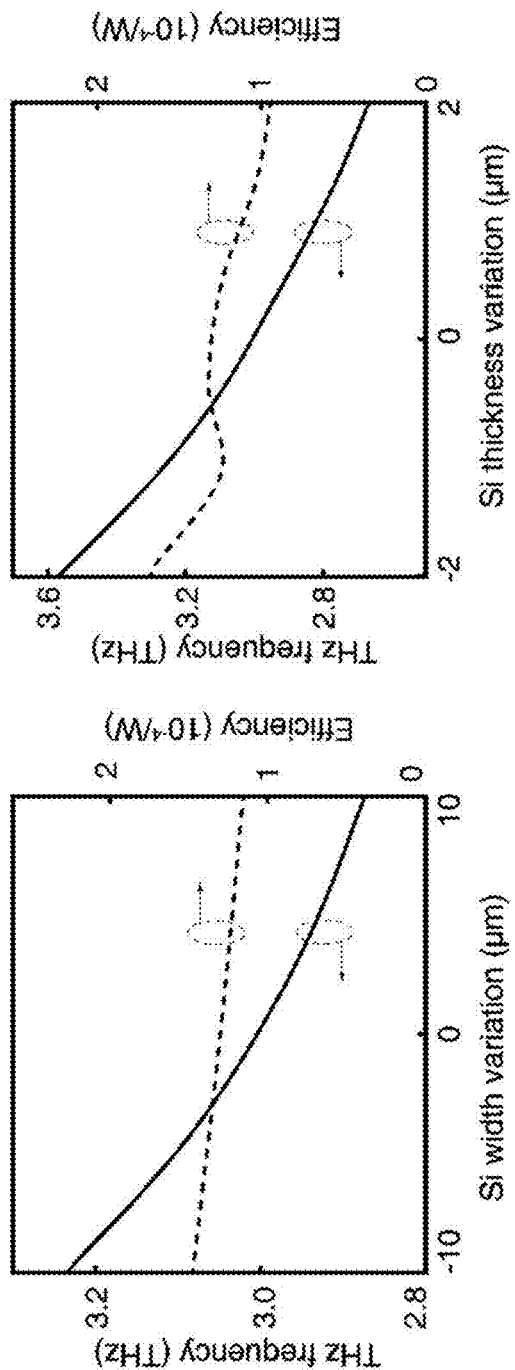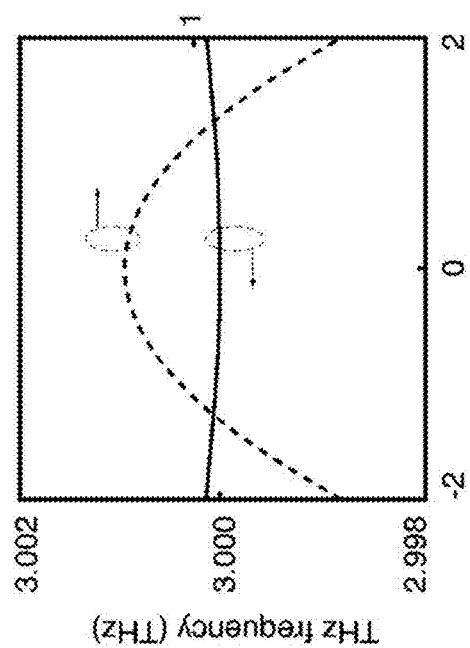
FIG. 4A
FIG. 4B
FIG. 4C

PHOTONIC DEVICE AND A TERAHERTZ SIGNAL GENERATOR

TECHNICAL FIELD

The invention relates to a photonic device and a terahertz (THz) signal generator, and particularly, although not exclusively, to a thin-film lithium niobate photonic device for THz signal generation.

BACKGROUND

The terahertz (THz) frequency range or the terahertz regime, generally defined as 0.3 to 10 THz, may be useful in different scientific and technological applications such as medical imaging, chemical identification, THz radar, and THz time-domain spectroscopy.

For example, the typical millimeter scanner equipped today in the airport surveillance is operated at 30-60 GHz. A better resolution could be attained when pushing into the THz frequency region. For medical applications, THz characteristics of non-ionizing and non-destructive would protect the patients compared to X-rays. The vibration/rotation fingerprint frequencies of many important molecules lie in the THz range, making it appealing for chemical identification of complex mixtures. In weather radar observation, micro-dopplers are suitably used to detect the velocity of slow-moving cloud, and THz penetrates through dust and clouds, all sorts of pollutants as well, compared to optical laser-based LiDAR.

SUMMARY OF THE INVENTION

In accordance with a first aspect of the invention, there is provided a photonic device comprising: an input waveguide arranged to receive input waves of at least two input frequencies and to generate photons at an output frequency associated with the at least two input frequencies; an output waveguide coupled to the input waveguide and arranged to collect the generated photons at the output frequency; wherein the output waveguide is further arranged to facilitate an amplification of the generated photons as the generated photons propagates along the output waveguide and arranged to output an amplified signal at the output frequency.

In an embodiment of the first aspect, the photons are generated based on difference-frequency generation (DFG).

In an embodiment of the first aspect, the output waveguide is arranged to facilitate nonlinear interaction of the generated photons.

In an embodiment of the first aspect, a power of the amplified signal increases quadratically as the generated photons propagates along the output waveguide.

In an embodiment of the first aspect, the output waveguide includes a silicon waveguide.

In an embodiment of the first aspect, the silicon waveguide has a width of 40-80 µm at the cross-section of the photonic device.

In an embodiment of the first aspect, the silicon waveguide includes semi-insulating silicon such that the output waveguide is further arranged to reduce a material loss of the amplified signal at the output frequency.

In an embodiment of the first aspect, the output frequency is at the terahertz regime.

In an embodiment of the first aspect, the input waveguide includes at least two portions each arranged to receive input waves of different input frequencies.

In an embodiment of the first aspect, the at least two portions have different width at the cross-section of the photonic device.

In an embodiment of the first aspect, the input waveguide includes an x-cut configuration.

In an embodiment of the first aspect, the input waveguide includes a first portion with a width of 0.5-3 µm and a second portion with a width of 5-20 µm.

In an embodiment of the first aspect, the input waveguide includes a second-order nonlinear material.

In an embodiment of the first aspect, the input waveguide includes lithium niobate (LN), alternatively the input waveguide includes lithium tantalate, III-V materials such as but not limited to gallium arsenide, aluminum gallium arsenide, gallium phosphide, gallium nitride.

In an embodiment of the first aspect, the device further comprises an intermediate insulator layer sandwiched between the input waveguide and the output waveguide.

In an embodiment of the first aspect, the input waveguide and the intermediate insulator layer are fabricated on a substrate to define a lithium niobate-on-insulator (LNOI) waveguide.

In an embodiment of the first aspect, the substrate includes a silicon-on-quartz substrate, alternatively substrates such as silicon on sapphire or suspended silicon (also known as silicon on air) is used.

In an embodiment of the first aspect, the input waveguide is further arranged to facilitate propagation of signal in the telecommunication band.

In an embodiment of the first aspect, the signal in the telecommunication band is transmitted under a single-mode operation.

In an embodiment of the first aspect, the intermediate insulator layer is arranged to prevent a leakage of the signal in the telecommunication band from the input waveguide to the output waveguide.

In an embodiment of the first aspect, the intermediate insulator layer flushes with at least a portion of the first waveguide.

In an embodiment of the first aspect, one or both of the input waveguide and the output waveguide further include an optical resonator structure.

In an embodiment of the first aspect, the optical resonator structure is arranged to circulate and to amplify at least a portion of an optical pump signal and/or the amplified signal at the output frequency.

In an embodiment of the first aspect, the optical resonator structure includes a racetrack resonator.

In accordance with a second aspect of the invention, there is provided a continuous-wave THz signal generator comprising: at least two optical pumps arranged to generate input waves of at least two input frequencies; and a photonic device in accordance with the first aspect.

In accordance with a third aspect of the invention, there is provided frequency-switchable continuous-wave THz signal generator comprising: an array of photonic devices in accordance with the first aspect, and a plurality of optical pumps arranged to generate input waves of a plurality of input frequencies, thereby generating a plurality of incremental phase-matching frequencies associated with differences of pairs of the input frequencies.

BRIEF DESCRIPTION OF THE DRAWINGS

Embodiments of the invention will now be described, by way of example, with reference to the accompanying drawings in which:

FIGS. 4A to 4C are plot showing tolerance to device fabrication variations. The phase-matched THz output frequency and peak conversion efficiency are plotted as functions of (a) Si width variation in FIG. 4A, (b) Si thickness variation in FIG. 4B, and (c) horizontal misalignment between optical waveguide and Si waveguide in FIG. 4C;

DETAILED DESCRIPTION OF THE PREFERRED EMBODIMENT

Figure 1A:
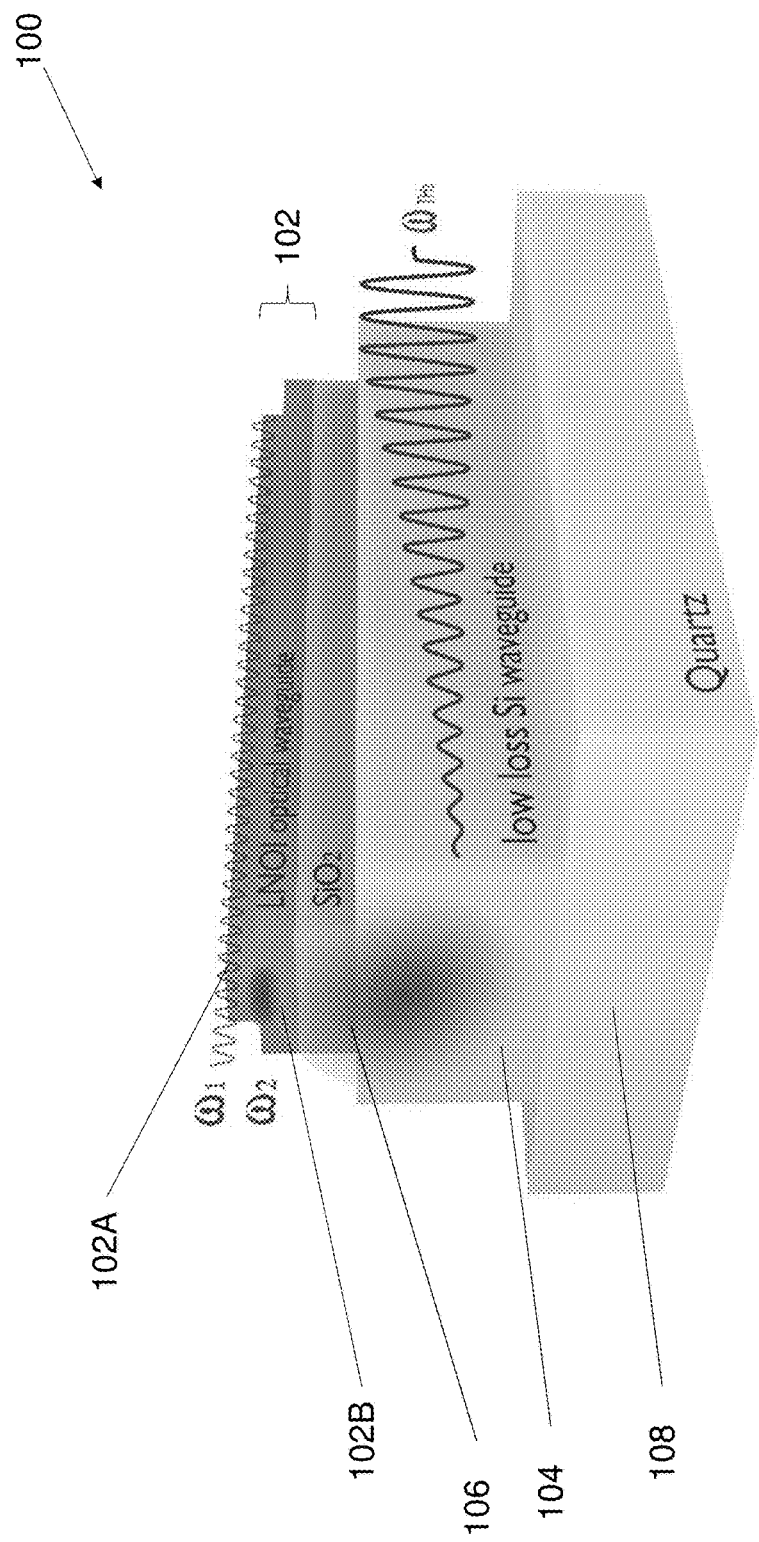
FIG. 1A is a schematic diagram showing a photonic device in accordance with an embodiment of the present invention; the diagram also illustrates two optical laser signals being injected into the top LNOI optical waveguides, while THz signals are generated and confined in the bottom Si THz waveguide.

The inventors have, through their own research, trials and experiments, devised that, the terahertz (THz) spectral window is of unique interests for plenty of applications, yet still in search for a low-cost, continuous-wave, room-temperature THz source with high generation efficiency.

Despite its undoubted usefulness, the THz interval may be relatively unexploited as an "unwrought land" due to the lack of efficient and low-cost THz sources. THz wave may be generated using electronic and optical methods, including quantum cascaded laser (QCL), photoconductive antenna (PCA), multiplier chains and difference-frequency generation (DFG).

For example, THz-QCLs are capable of providing milliwatt-level THz powers through a cascade of intra-sub-band transitions, but usually require operation at cryogenic temperatures to avoid thermal photon disruption, or relative complex system with integration of a gas cell.

Alternatively, PCA-based THz sources may achieve significant conversion efficiencies using plasmonic antenna structures, but are typically limited to pulsed operations due to relatively low damage thresholds. The conversion efficiencies of PCA also roll off substantially beyond 1 THz, limited by the carrier lifetimes of the semiconductor used.

In another example, multiplier chains based on Schottky diodes generate THz emission by multiplying the frequency of a microwave source many times, which also leads to decreasing efficiencies and cumulative noises at high frequencies.

As a result, the practical feasibility of current THz systems may be still limited by the lack of a compact, continuous-wave, room-temperature THz source with high efficiencies.

Without wishing to be bound by theory, the inventors devised that DFG may be more preferable for generating continuous-wave THz radiation, by mixing two optical signals whose frequencies are separated by the desired THz frequency. Advantageously, DFG benefits from the wide availability of high-performance and compact optical lasers, potentially enabling relatively high THz radiation powers at room temperature through a portable device platform. DFG-based THz generation also enjoys a quadratic scaling with frequency (efficiency $\sim\omega^2$), ideally suited for applications on the higher end of the THz spectrum.

Preferably, second-order ($\chi^2$) nonlinear material platforms, including lithium niobate ($LiNbO_3$, LN), gallium phosphide (GaP), gallium arsenide (GaAs), and zinc telluride (ZnTe), gallium Selenide (GaSe) and zinc germanium phosphide (ZGP) may be used for DFG-based THz generation. As appreciated by skilled person in the art, the composition of the III-V material may be engineered to adjust energy bandgap of the material to generate photons of different wavelengths. More preferably, LN is used for THz-DFG in some preferable embodiments as described in the following disclosure, due to its large $\chi^{(2)}$ nonlinear coefficient (390 μm/V in the THz region), relatively high optical damage threshold, and ultra-low optical absorption of ~0.001 dB/cm in the near-infrared spectral range.

Despite the many advantages of LN-based DFG-THz generation, the overall conversion efficiencies may be relatively low i.e. $<10^{-7}$ $W^{-1}$ for some example waveguide approaches and $<10^{-8}$ $W^{-1}$ in bulk LN crystals (numbers for pulsed operations have been normalized to a continuous-wave scenario). Unlike typical nonlinear optical processes where all input and output wavelengths are on the same order, a THz generation process features a large wavelength mismatch between the optical pumps and the created THz wave, often across 2-3 orders of magnitude. As a result, it may be challenging to realize strong optical/THz confinement, reasonably high nonlinear overlap and phase matching at the same time, compromising the THz conversion efficiency.

Another limiting factor is the large THz absorption coefficient of LN, i.e. 20 $mm^{-1}$ at 3 THz. The large material absorption limits the maximum DFG interaction lengths in a collinear periodically-poled LN (PPLN) crystal and ultimately the THz generation efficiencies, unless operating at cryogenic temperatures. Using a Cherenkov or tilted-pulse-front geometry could greatly alleviate the THz attenuation issue, since the generated THz signal is immediately extracted out of the LN crystal from a different angle to the laser pump. However, the non-collinear configuration also implies that the generated THz signal does not contribute to the coherent nonlinear buildup anymore, leading to a moderate linear power scaling over interaction distance (as opposed to quadratic scaling in a collinear scenario).

Alternatively, thin-film LN-on-insulator (LNOI) platform may be applied in ultra-efficient nonlinear optical devices, owing to the much stronger light intensity in these sub-wavelength optical structures. However, THz generation has not been realized in the LNOI platform, likely due to the large wavelength mismatch between THz and optical waves.

In accordance with a preferable embodiment of the present invention, there is provided a hybrid LNOI/Si coupled-waveguide structure that can dramatically increase the DFG-THz generation efficiencies by satisfying the following requirements simultaneously: strong confinements of both the optical pumps and THz waves, a good overlap between the associated optical and THz modes, the phase-matching condition, and a long nonlinear interaction distance without significant THz attenuation.

Preferably, the device may comprise a top LNOI optical waveguide and a bottom silicon (Si) THz waveguide, the ability to independently control the optical and THz device layers may achieve strong confinement and low-loss propagation for both waveguides, as well as a relatively high nonlinear optical overlap. The estimated conversion efficiencies may be as high as $3.5 \times 10^{-4}$ $W^{-1}$ at 3 THz with high tolerance to device fabrication variations, which is significantly higher than other LN-based DFG-THz generators. In addition, the conversion efficiencies may be further enhanced to $2.2 \times 10^{-2}$ $W^{-1}$ using an optical resonator structure, without the need of exotic quality (Q) factors or precise alignments of resonance modes.

With reference to FIG. 1A, there is shown an embodiment of a photonic device 100 comprising: an input waveguide 102 arranged to receive input waves of at least two input frequencies (e.g. $\omega_1$ and $\omega_2$) and to generate photons at an output frequency (e.g. $\omega_{THz}$) associated with the at least two input frequencies; and an output waveguide 104 coupled to the input waveguide 102 and arranged to collect the generated photons at the output frequency; wherein the output waveguide 104 is further arranged to facilitate an amplification of the generated photons as the generated photons propagates along the output waveguide 104 and arranged to output an amplified signal at the output frequency.

In this example, the photonic device 100 comprises an x-cut LNOI waveguide 102 disposed adjacent to a Si waveguide 104, and the two wave guides are physically separated by a layer of $SiO_2$ insulator 106. The x-cut profile of the input LNOI waveguide provides two portions each having a different width at the cross-section each, and are arranged to receive input waves of different frequency, such that photons of a third frequency may be generated based on DFG, e.g. $\omega_1 - \omega_2 = \omega_{THz}$.

Preferably, the output waveguide includes a silicon waveguide 104 which collects the generated photons of the third/output frequency, and further guides the generated photons to propagate along the silicon waveguide 104 to perform nonlinear interaction. As the generated photons propagates along the output waveguide 104, the interactions of the photons causes an amplification of the photons during propagation within the Si waveguide, therefore the wave or signal outputted by the Si waveguide 104 is amplified. For example, a power of the amplified signal may increase quadratically as the generated photons propagates along the output waveguide, which will be further described later in the disclosure.

Preferably, the silicon waveguide 104 includes semi-insulating (or high resistivity) silicon such that the output waveguide is further arranged to reduce a material loss of the amplified signal at the output frequency. Advantageously, minimizing the material loss may allow shortening the total interaction distance (i.e. the length of the waveguide/photonic device) as the amplification relies on the interaction distance and efficiency.

In an example operation, two optical laser signals in the telecom band (~200 THz, separated by 3 THz) are frequency mixed for generation of 3-THz signal. In the photonic device 100, the top thin-film LN waveguide 102 provides low-loss optical confinement and $\chi^{(2)}$ nonlinearity for the DFG process. The bottom THz waveguide 104 co-propagating with the optical waveguide is formed by high-resistivity Si with a low material loss tangent of $10^{-5}$ at THz. The Si waveguide 104 collects and continuously guides the generated THz waves such that the nonlinear interaction could coherently build up.

In addition, a 1.5-μm intermediate $SiO_2$ layer 106 is used to prevent the optical mode from leakage into the Si substrate 104. Finally, the $LN/SiO_2/Si$ stack sits on top of a quartz substrate 108 with a relatively low THz loss tangent of $10^{-4}$ at 3 THz. Preferably, the design flexibility in the multi-layer system allows independently optimizing the effective indices, losses and nonlinear interaction strength of the optical and THz waveguides.

By further including the pump source(s) coupled to the top waveguide, the photonic device 100 may be used as a continuous-wave (CW) THz signal generator, by injecting CW pump waves to the LNOI waveguide 102.

In addition, the photonic device 100 can also include other materials for nonlinear optics (e.g. LiTaO3, III-V) and for THz waveguide (e.g. polymer materials, metal coplanar waveguides), as well as resonator structures to further enhance the efficiency.

Figure 1B:
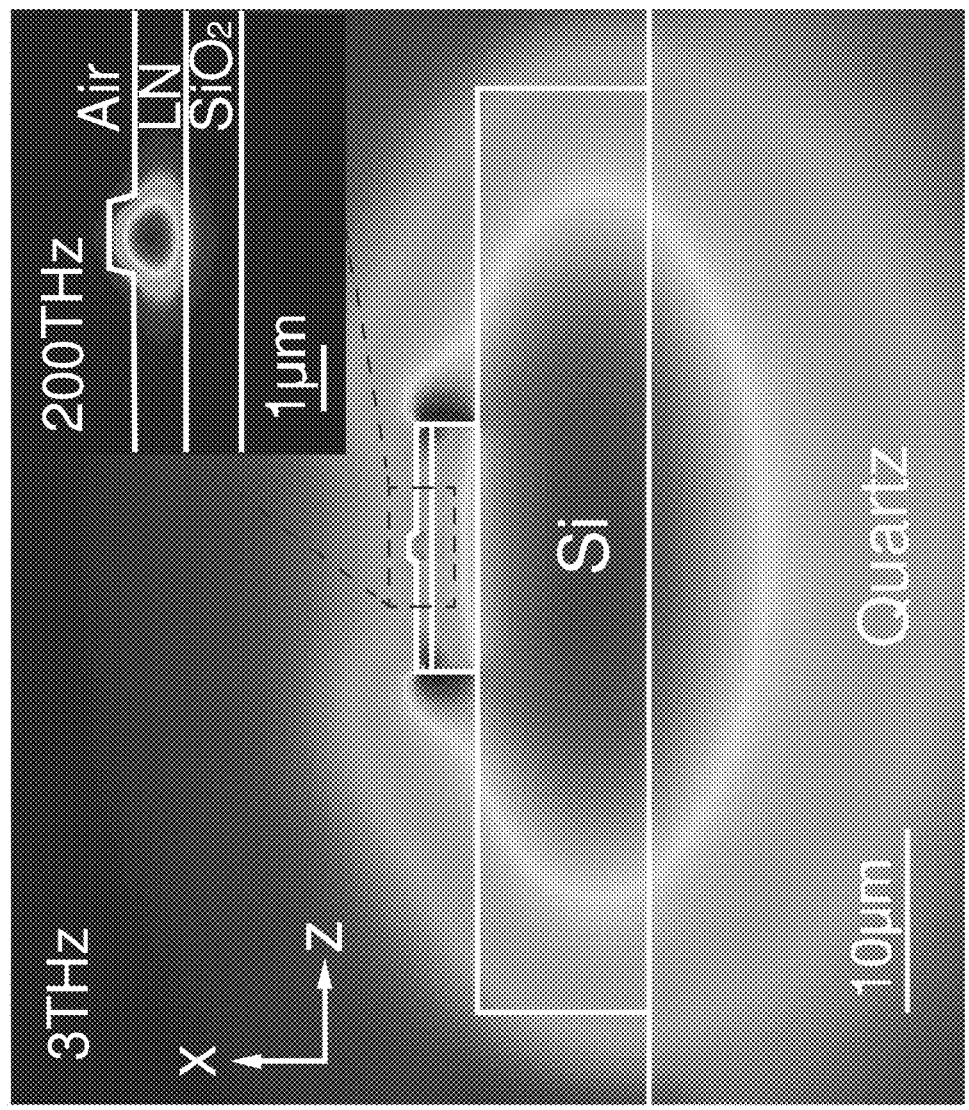
FIG. 1B is a color plot showing numerically simulated electric field distributions ($E_z$) of the THz mode of the photonic device of FIG. 1A, at 3 THz (main panel) and the optical mode at 200 THz (inset), which shows strong field confinement at both frequencies.

With reference also to FIG. 1B, there is shown the simulated THz (main panel) and optical (inset) mode profiles, both in transverse-electric (TE) polarization (i.e. major electric fields are in plane), using a finite difference eigen-mode (FDE) solver (Mode Solutions, Anays/Lumerical). In this example, the top x-cut LN optical waveguide 102A features a first portion with a width of 0.5-3 μm (preferably 1 μm) at the top and a rib height of 200 nm, and a second portion an un-etched slab 102B thickness of 400 nm and a width of 5-20 μm (preferably 10 μm) at the bottom of the rib or the first portion, allowing for single-mode operation at telecom wavelengths, whereas the bottom Si THz waveguide 104 has a width of 40-80 μm (preferably ~50 μm) and an thickness of ~8 μm.

The optical propagation loss of the LNOI waveguide could be well below 0.1 dB/cm using state-of-the-art LNOI fabrication technologies. The simulated THz loss of the Si waveguide is ~7 dB/cm at 3 THz, sufficient to support a total device length of >1 cm without excessive THz loss, which is crucial for a coherent DFG signal buildup. The simulated loss numbers have taken into account the absorption losses of all materials including LN, deposited $SiO_2$, high-resistivity Si and quartz. Besides loss considerations, the optical-THz nonlinear interaction strength may be optimized by fine tuning the LN slab thickness, slab width (10 μm, same as the $SiO_2$ layer width) as well as the Si THz waveguide dimensions.

Preferably, the photonic device 100 may be fabricated by depositing (or growing) a layer of Silicon dioxide on a the substrate includes a silicon-on-quartz substrate, and a layer of LN on top of the oxide layer, followed by a step etching process to form the LNOI waveguide and the bottom Si waveguide.

Despite the need for an unconventional LNOI/Si/quartz substrate, the photonic device configuration can be fabricated through thin-film production services and standard nanofabrication processes. Preferably, silicon-on-quartz substrates may be used for THz photonics. For example, single-mode THz waveguides may be fabricated using high-resistivity Si layer of <100 μm thickness. On the other hand, various choices of substrates for LNOI are also available (e.g. NANOLN), including Si, LN, quartz and sapphire, showing the feasibility to achieve strong bonding between the LN thin-film and the Si-on-quartz substrate. Alternatively, other choices of second-order nonlinear (optical) material as abovementioned may also be used.

For example, based on the thin-film LN/Si/quartz fabrication technology, the LN optical rib waveguides can first be fabricated using a combination of electron-beam lithography (EBL) and reactive ion etching (RIE). The Si THz waveguides can subsequently be defined using aligned photolithography followed by standard deep $SiO_2$/Si dry etching.

To achieve an efficient THz generation process with coherent signal buildup throughout the entire device length, it is important to fulfill the phase-matching condition.

In the collinear guided-wave configuration, the phase-matching condition can be expressed as $\Delta k = k_{opt1} - k_{opt2} - k_{THz} = 0$, where $k_{opt1,2}$ and $k_{THz}$ are the wavevectors of the two pump modes and the THz mode, respectively. Since the two optical frequencies are not too far apart, the wavevector difference $k_{opt1} - k_{opt2}$ can be approximately expressed in terms of the group refractive index $n_{g,opt}$ (ignoring second- and higher-order dispersion effects). The phase matching condition is therefore simplified to the matching between optical group index and THz phase index, similar to the velocity matching in an electro-optic modulator:

$$\Delta k = k_{opt1} - k_{opt2} - k_{THz} = \frac{2\pi}{c} f_{THz} |n_{g,opt} - n_{THz}| \quad (1)$$

In a bulk LN crystal, these wavevectors are usually predetermined by the material refractive indices, requiring a PPLN structure to achieve quasi-phase matching. In contrast, the photonic device configuration allows flexible tuning of the THz effective indices by engineering the Si waveguide dimensions, without the need for periodic domain inversion.

Figure 2:
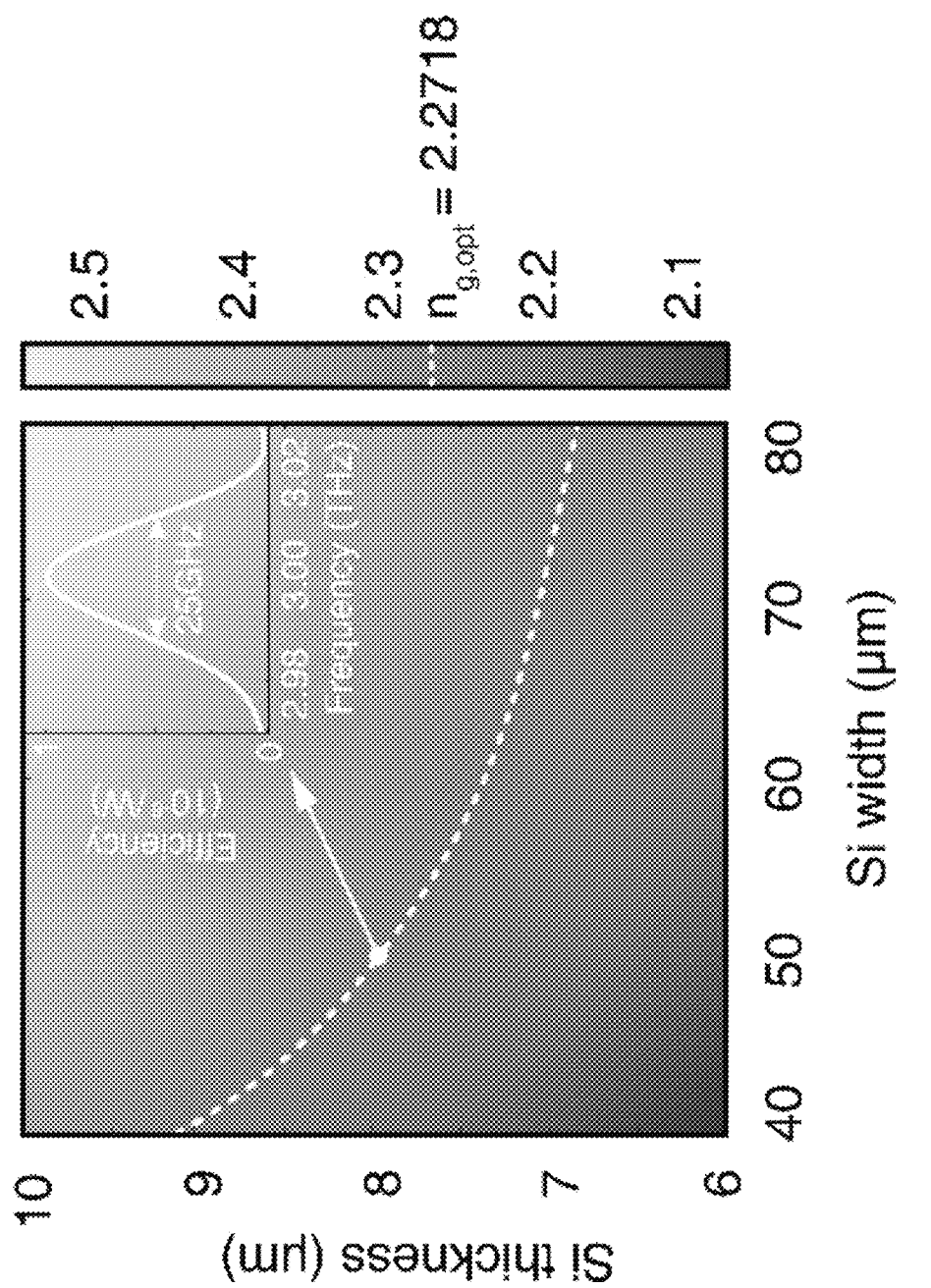
FIG. 2 is a color plot showing phase matching between the THz and optical modes, the 2D color map shows the $n_{THz}$ dependence on the width and thickness of the Si waveguide, the white dashed line corresponds to the structure parameters with $n_{THz}=2.27$, which is matched with the optical group index, and the inset shows THz generation efficiency as a function of THz frequency for a typical Si waveguide with parameters, showing a 25-GHz phase-matching bandwidth (FWHM) for a 1-cm device.

With reference to FIG. 2, there is shown the numerically simulated effective index (color coded) at 3 THz as a function of various Si waveguide widths and thicknesses. The dashed line corresponds to a collection of phase-matched structure parameters with an index of $n_{THz}=2.27$, which is matched with the optical group index $n_{g,opt}$ of the LNOI rib waveguide with parameters discussed above. It should be noted that the Si waveguide sees a significant geometric dispersion, i.e. $n_{THz}$ changes substantially with frequency. As a result, other waveguide parameters away from the dashed line in FIG. 2 can also support phase-matched THz generation processes, but at shifted THz frequencies. For a fixed waveguide parameter, the phase matching bandwidth is ~25 GHz (full width at half maximum, FWHM) for a device length of 1 cm (inset of FIG. 2), taking into account both geometric and material dispersions.

The power evolution of THz waves in the photonic device follows a coupled-mode theoretical model similar to that used in common nonlinear optical waveguides. The inventors first consider the case of a lossless waveguide, where the generated DFG signal scales linearly with the optical powers of each pump lasers and quadratically with the device length. The THz generation efficiency F (normalized by pump optical power) could be calculated using the following equation:

$$\Gamma = \frac{P_{THz}}{P_{opt1} \cdot P_{opt2}} = \eta L^2 \cdot \text{sinc}^2\left(\frac{\Delta k L}{2}\right) \quad (2)$$

where $P_{opt1,2}$ are the optical powers of input lasers at $\omega_1$ and $\omega_2$, $P_{THz}$ is the output THz power at $\omega_{THz}$, L is the waveguide length. η is the normalized conversion efficiency (normalized by both pump power and device length) given given by:

$$\eta = \frac{2\omega_{THz}^2 d_{eff}^2 \zeta}{n_{opt}^2 n_{THz} \varepsilon_0 c^3} \quad (3)$$

where $\varepsilon_0$ and c are the permittivity and speed of light in vacuum, respectively, $\omega_{THz}$ is the angular frequency of the intended THz wave, $n_{opt}$ and $n_{THz}$ are the effective refractive indices of the optical (assuming $n_{opt1} \approx n_{opt2}$) and terahertz fundamental TE modes, respectively, and $d_{eff}=d_{33}=\chi^{(2)}/2=195$ pm/V is the effective nonlinear susceptibility at 3 THz, which has taken into account the $\chi^{(2)}$ dispersion due to TO phonon, A is the effective spot area between the three waves:

$$\zeta = \frac{A_{overlap}^2}{A_{opt}^2 \cdot A_{THz}} = \frac{\left(\int_{LN} |E_{opt,z}|^2 E_{THz,z}^* dxdy\right)^2}{\left(\int_{all} |E_{opt}|^2 dxdy\right)^2 \left(\int_{all} |E_{THz}|^2 dxdy\right)} \quad (4)$$

where $\int_{LN}$ and $\int_{all}$ denote cross-section integration over the LN region only and all space, respectively. $E_{opt}$ and $E_{THz}$ are the electric fields of the optical and THz modes and $E_{opt,z}$ and $E_{THz,z}$ are their corresponding z components that make use of the largest nonlinear coefficient $d_{33}$.

When taking into account the absorption of the THz mode, the conversion efficiency expression in Eq. (2) can be modified by adding an imaginary part to the phase mismatch as $\Delta k' = \Delta k - i\beta$, where β is the THz attenuation coefficient. The conversion efficiency in lossy medium is then given by:

$$\Gamma = \eta L^2 \cdot \text{sinc}^2\left(\frac{\Delta k' L}{2}\right) = \frac{2\omega_{THz}^2 d_{eff}^2}{n_{opt}^2 n_{THz} \varepsilon_0 c^3} \cdot \zeta \cdot \text{sinc}^2\left(\frac{(\Delta k - i\beta) L}{2}\right) \cdot L^2 \quad (5)$$

Figure 3B:
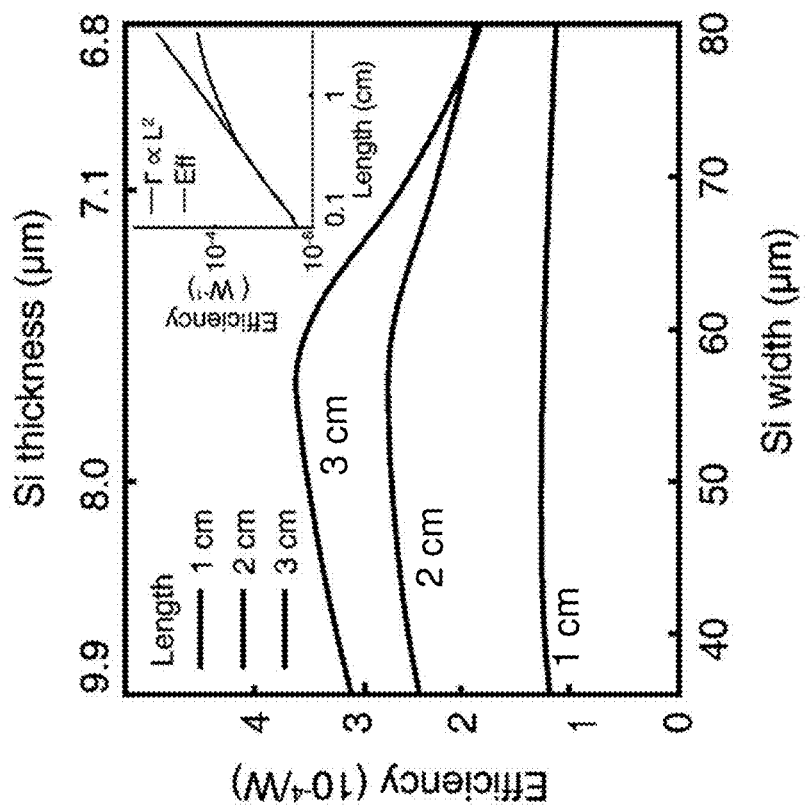
FIGS. 3A and 3B are plots showing an optical-THz effective spot area and THz loss versus the THz waveguide dimensions. The waveguide width and thickness are changed jointly following the phase-matching curve in FIG. 2B, the conversion efficiency is plotted as a function of the THz waveguide dimension in cases of various device lengths. Inset shows the conversion efficiency versus device length in logarithmic scale, showing deviation from ideal quadratic dependence for device lengths >1 cm due to THz loss.
Figure 3A:
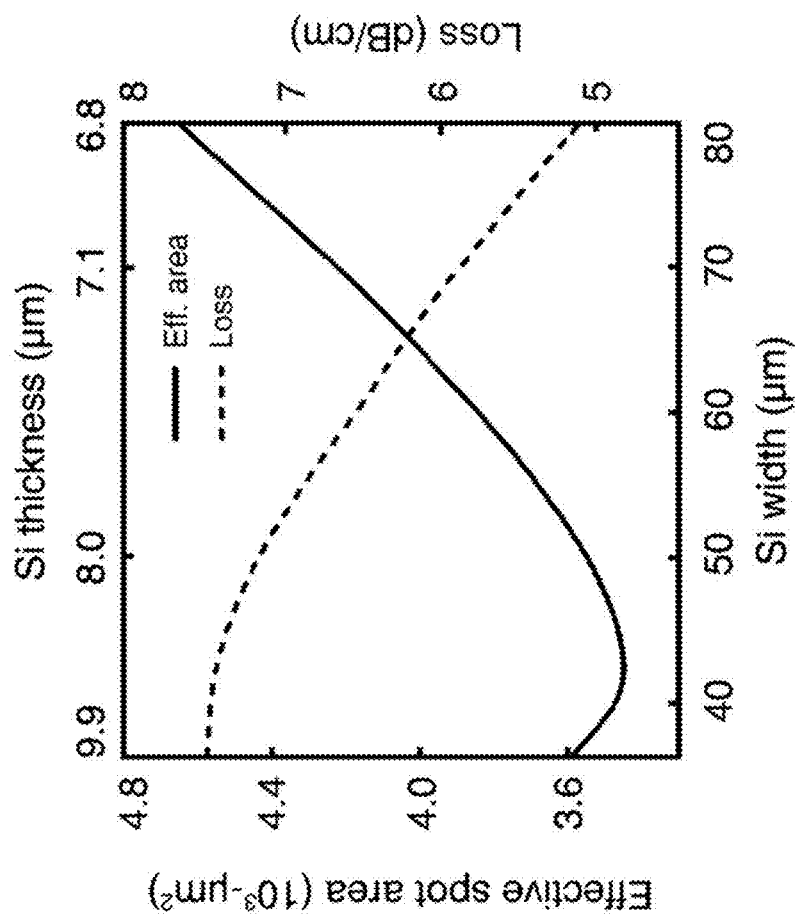

As a result, the overall conversion efficiency shall be optimized not only by minimizing the effective spot area A, but at the same time maintaining a reasonable THz loss. FIG. 3A shows the dependence of the overlap factor as defined in Eq. (4) and THz loss on the geometry of the Si waveguide. Here the width and thickness of the Si waveguide are changed jointly following the white dashed line in FIG. 2 to ensure the phase-matching condition. While the minimum spot area A takes place at a width of ~42 μm, the THz loss shows a continuously decreasing trend with the increase of Si waveguide width. Therefore, the optimal structural parameters may be dependent on the total device length, since a longer device has more stringent requirement on the THz loss.

Preferably, for a 1-cm device, the optimal conversion efficiency of $1.3\times10^{-4}$ $W^{-1}$ in continuous-wave operation can be achieved with a 50-μm width and an 8-μm thickness, the parameters of which have been used for the calculation of THz generation bandwidth in the inset of FIG. 2. For longer devices, the optimal structure shifts towards larger Si waveguide widths to compensate for the increasing cumulative THz losses, as shown in FIG. 3B.

The maximal THz generation efficiencies for 2-cm and 3-cm devices are $2.6 \times 10^{-4}$ $W^{-1}$ and $3.5 \times 10^{-4}$ $W^{-1}$ respectively. This indicates that the power scaling characteristic has deviated from the quadratic dependence in a lossless model when the device length is beyond 1 cm due to significant THz losses, as shown in the inset of FIG. 3B, although the overall conversion efficiency still increases with a longer device. The maximum THz generation achievable in the photonic device is at least significantly higher than other example LN-based DFG devices at room temperature, thanks to the strong light confinements and nonlinear overlap. In addition, micro-watt-level continuous-wave THz emission could be achieved with reasonable optical input powers of 100 mW and compact device footprint. Such optical power levels are well within the power handling capability of typical LNOI devices, e.g. optical powers of ~300 mW in LNOI waveguides and circulation powers of >50 W in LNOI microresonators. Using MgO-doped LNOI thin films could allow even higher input powers, potentially further increasing the achievable THz powers.

Moreover, the photonic device also features high tolerance to fabrication variations and alignment inaccuracy. Since the optical group index of the LNOI waveguide (~2.27) is relatively insensitive to geometric variations.

The impact of divergence in Si waveguide width and thickness from a base-case scenario of 50×8 μm, which was previously optimized for 1 cm long device. In this example, although deviation in waveguide dimensions moves the THz effective index away from the phase-matching point at 3 THz, a new phase-matching point will emerge at a shifted THz frequency due to the relatively large geometric dispersion. In other words, fabrication variations within a certain range do not lead to performance degradation, but rather tunes the optimal THz generation frequency. For example, as shown in FIGS. 4A and 4B, the changes in the dimensions of the Si waveguide only affect the output frequencies, with the efficiency being maintained substantially the same.

Indeed, this tuning characteristic could provide a simple and effective way to tune the output THz frequency of the source. Another possible fabrication error is the mis-alignment between the optical waveguide and the bottom Si waveguide, the effect of which is shown in FIG. 4C. it may be observable that the output THz frequency and conversion efficiency are not affected much by fabrication mis-alignment. An alignment error of ±1 μm, which is achievable in most academic mask aligners, leads to negligible change in the THz frequency and the conversion efficiency as shown in FIG. 4C.

Figure 5A:
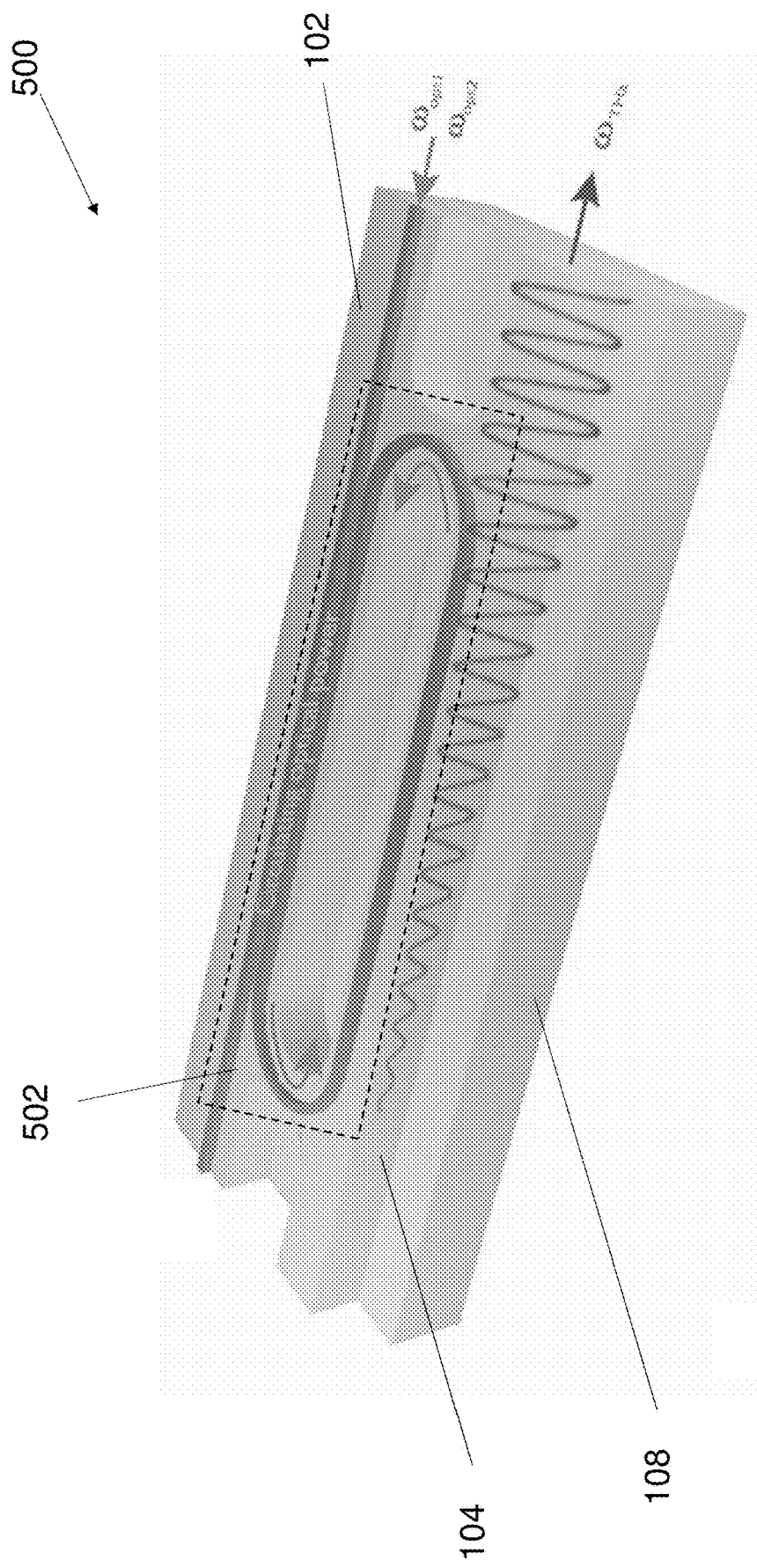
FIG. 5A is a schematic illustration of an alternative embodiment of the photonic device with an embedded racetrack resonator to enhance the effective pump power.

Optionally, one or both of the input waveguide 102 and the output waveguide 104 further include an optical resonator structure 500, to further improve the THz generation efficiency of the THz generator. Preferably, using a racetrack optical resonator 502 as shown in FIG. 5A may achieve an improvement of more than 2 orders of magnitude.

Preferably, the multi-layer structural parameters remain the same as in previous embodiments, such that the phase-matching condition can still be satisfied. However, instead of running the optical pumps through the device only once, this resonator configuration 500 can fully exploit the low-loss property of the LNOI platform and dramatically increase the effective pump powers inside the optical cavity, and the optical resonator structure may circulate and to amplify the optical pump signal and/or the amplified signal at the output frequency.

Preferably, the racetrack resonator 502 may be defined with a bending radius of 80 μm and a straight-section length of 1 mm, which is critically coupled with a loaded Q factor of $1 \times 10^6$. The parameters chosen here are well achievable in the LNOI platform, as ultrahigh resonator Q factors are found to be over $10^7$. In this case, the free-spectral range (FSR) is estimated as 50 GHz, with a linewidth of 200 MHz, leading to a finesse of 250 and an average round-trip number of ~80.

As a result, the effective pump power sees a 40-times amplification inside the resonator compared with a straight-waveguide case. If both optical pumps are tuned into resonance, the system conversion efficiency is enhanced by a factor of 6,400 from a 1-mm waveguide device a further increase from the non-resonant best-case scenario with a more compact footprint. It should be noted that the choice of racetrack resonator size within a certain range (e.g. straight-section length of 1~3 mm) does not change the overall THz generation efficiency much, since a smaller resonator leads to higher circulating power but shorter THz accumulation distance. Here the inventor chose a 1-mm length to minimize the impact of THz loss while maintaining a high straight-to-bend length ratio (~80%).

A common challenge in resonator-based nonlinear optical systems is the difficulty to precisely match the resonant frequencies of all associated modes within the phase-matching bandwidth. The photonic device of the present invention could readily achieve mode matching and phase matching without special engineering and precise frequency alignment.

For the 1-mm device discussed above, the phase-matching bandwidth (FWHM) is ~200 GHz, while the resonator FSR is 50 GHz. Therefore it is possible to straightforwardly choose two optical resonance modes that are separated by ~3 THz, which automatically fall inside the phase-matching region.

Figure 5B:
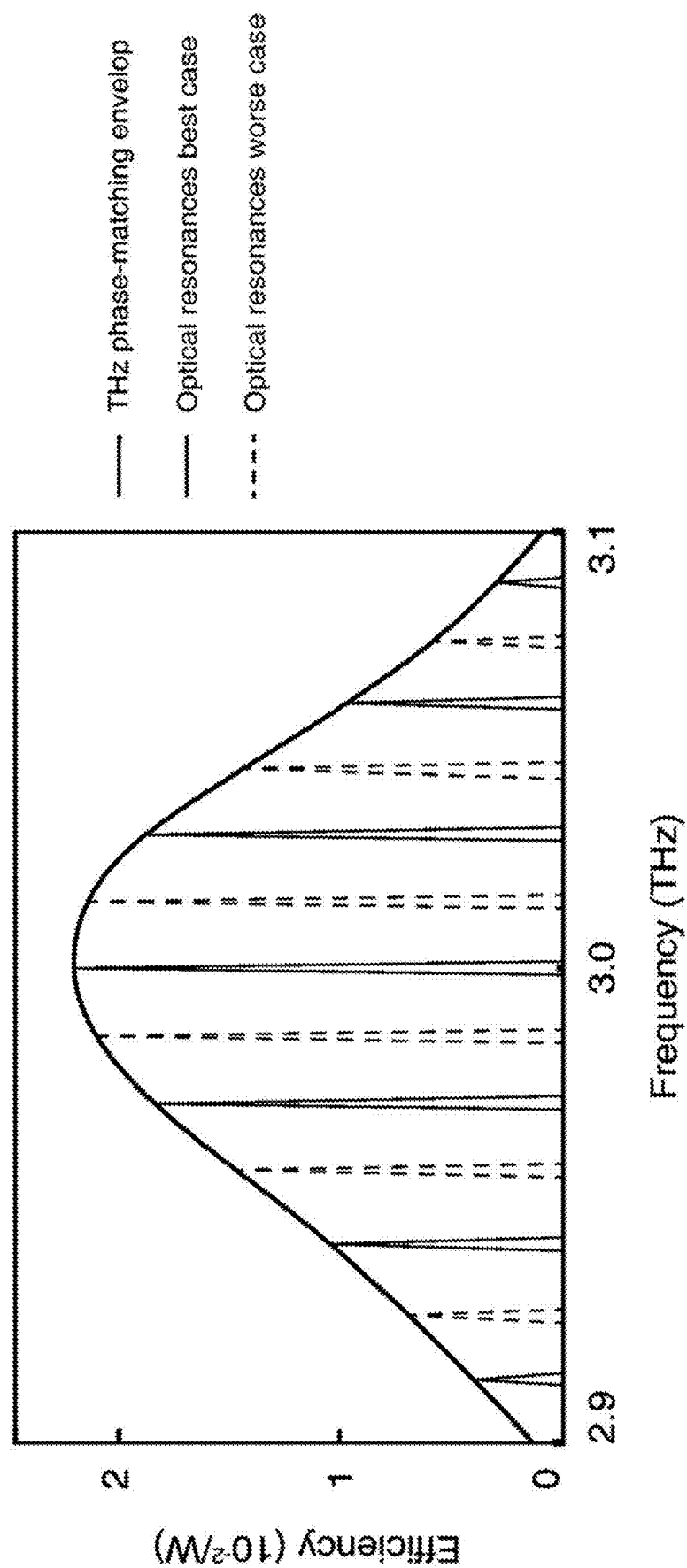
FIG. 5B is a plot showing phase-matching envelope and the distribution of optical resonance modes for a 1-mm racetrack device showing high robustness for mode and phase matching in the photonic device of FIG. 5A.

With reference to FIG. 5B, there is shown the best-case scenario where the optical resonance frequency difference is exactly matched with the phase-matching peak. Even for the worst case, where the phase-matching peak is right in the middle of two optical resonance modes, the overall conversion efficiency Γ is only compromised by a small percentage from the optimal case, showing high robustness for practical applications. It is also noted that this feature of straightforward mode/phase matching is not affected by the resonator size, since a smaller device gives rise to coarser resonances but at the same time a larger phase-matching bandwidth.

These embodiments may be advantageously that an efficient continuous-wave THz source based on a hybrid LNOI/silicon platform is provided. The multi-layer structure allows engineers to independently design the optical and THz waveguides to achieve strong confinement and low loss for both frequencies, yielding an efficient DFG process.

Advantageously, the photonic device makes use of thin-film lithium-niobate-on-insulator (LNOI) platform for efficient THz generation by achieving sub-wavelength scale light confinement, strong nonlinear interaction and low THz loss at the same time.

Moreover, the optical-based THz generator allows straightforward signal modulation at GHz data bandwidths, using either off-chip or on-chip LN electro-optic modulators, ideally suited for THz communications applications. In addition, the photonic device may be used as continuous-wave THz source which may be further applied in a wide variety of applications including spectroscopy, communications and remote sensing.

In an alternative embodiment, the photonic device may be further built as a frequency-switchable continuous-wave THz signal generator, by including a plurality of optical pumps arranged to generate input waves of a plurality of input frequencies to an array of the photonic device, thereby generating a plurality of incremental phase-matching frequencies associated with differences of pairs of the input frequencies.

In this example, a frequency switchable continuous-wave THz source may be realized by implementing an array of the photonic device and the waveguides with incremental phase-matching frequencies. Fast switching of the THz frequency can be achieved by electro-optically routing the pump signals into different channels on demand leveraging the high-performance electro-optic functionality in the LNOI platform.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

Any reference to prior art contained herein is not to be taken as an admission that the information is common general knowledge, unless otherwise indicated.

The invention claimed is:

1. A photonic device comprising:
   an input waveguide arranged to receive input waves of at least two input frequencies and to generate photons at an output frequency associated with the at least two input frequencies; the input waveguide including a second-order nonlinear material;
   an output waveguide coupled to the input waveguide and arranged to collect the generated photons at the output frequency; the output waveguide co-propagating with the input waveguide;
   an intermediate insulator layer sandwiched between the input waveguide and the output waveguide; and
   a substrate on which the output waveguide, the intermediate insulator layer and the input waveguide are supported;
   wherein the output waveguide is further arranged to facilitate an amplification of the generated photons as the generated photons propagates along the output waveguide and arranged to output an amplified signal at the output frequency.

2. The photonic device in accordance with claim 1, wherein the photons are generated based on difference-frequency generation (DFG).

3. The photonic device in accordance with claim 1, wherein the output waveguide is arranged to facilitate nonlinear interaction of the generated photons.

4. The photonic device in accordance with claim 3, wherein a power of the amplified signal increases quadratically as the generated photons propagates along the output waveguide.

5. The photonic device in accordance with claim 1, wherein the output waveguide includes a silicon waveguide.

6. The photonic device in accordance with claim 5, wherein the silicon waveguide has a width of 40-80 µm at the cross-section of the photonic device.

7. The photonic device in accordance with claim 5, wherein the silicon waveguide includes semi-insulating silicon such that the output waveguide is further arranged to reduce a material loss of the amplified signal at the output frequency.

8. The photonic device in accordance with claim 7, wherein the output frequency is at the terahertz regime.

9. The photonic device in accordance with claim 1, wherein the input waveguide includes at least two portions each arranged to receive input waves of different input frequencies.

10. The photonic device in accordance with claim 9, wherein the at least two portions have different width at the cross-section of the photonic device.

11. The photonic device in accordance with claim 10, wherein the input waveguide includes an x-cut configuration.

12. The photonic device in accordance with claim 11, wherein the input waveguide include a first portion with a width of 0.5-3 µm and a second portion with a width of 5-20 µm.

13. The photonic device in accordance with claim 1, wherein the input waveguide includes lithium niobate (LN), LiTaO3 or a III-V semiconductor material including gallium arsenide, aluminum gallium arsenide, gallium phosphide or gallium nitride.

14. The photonic device in accordance with claim 1, wherein the substrate includes quartz or sapphire.

15. The photonic device in accordance with claim 1, wherein the input waveguide is further arranged to facilitate propagation of signal in the telecommunication band.

16. The photonic device in accordance with claim 15, wherein the signal in the telecommunication band is transmitted under a single-mode operation.

17. The photonic device in accordance with claim 15, wherein the intermediate insulator layer is arranged to prevent a leakage of the signal in the telecommunication band from the input waveguide to the output waveguide.

18. The photonic device in accordance with claim 1, wherein the intermediate insulator layer flushes with at least a portion of the first waveguide.

19. The photonic device in accordance with claim 1, wherein one or both of the input waveguide and the output waveguide further include an optical resonator structure.

20. The photonic device in accordance with claim 19, wherein the optical resonator structure is arranged to circulate and to amplify at least a portion of an optical pump signal and/or the amplified signal at the output frequency.

21. The photonic device in accordance with claim 20, wherein the optical resonator structure includes a racetrack resonator.

22. A continuous-wave THz signal generator comprising: at least two optical pumps arranged to generate input waves of at least two input frequencies; and a photonic device in accordance with claim 1.

23. A frequency-switchable continuous-wave THz signal generator comprising: an array of photonic devices in accordance with claim 1, and a plurality of optical pumps arranged to generate input waves of a plurality of input frequencies, thereby generating a plurality of incremental phase-matching frequencies associated with differences of pairs of the input frequencies.

24. The photonic device in accordance with claim 1, wherein the input waveguide, the intermediate insulator layer, the output waveguide, and the substrate are formed in a stack structure of LN/SiO2/Si/quartz, LN/SiO2/Si/sapphire or LN/SiO2/Si.

* * * * *